United States Patent
Lee et al.

(10) Patent No.: US 11,887,863 B2
(45) Date of Patent: Jan. 30, 2024

(54) DOUBLE-SIDED PARTIAL MOLDED SIP MODULE

(71) Applicant: STATS ChipPAC Pte. Ltd., Singapore (SG)

(72) Inventors: HunTeak Lee, Gyeongi-do (KR); Gwang Kim, Gyeongi-do (KR); Junho Ye, Seoul (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 144 days.

(21) Appl. No.: 17/447,029

(22) Filed: Sep. 7, 2021

(65) Prior Publication Data
US 2023/0074430 A1   Mar. 9, 2023

(51) Int. Cl.
| | |
|---|---|
| *H01L 21/48* | (2006.01) |
| *H01L 21/56* | (2006.01) |
| *H01L 23/60* | (2006.01) |
| *H01L 23/00* | (2006.01) |
| *H01L 25/065* | (2023.01) |
| *H01L 25/00* | (2006.01) |
| *H01L 23/498* | (2006.01) |
| *H01L 23/31* | (2006.01) |

(52) U.S. Cl.
CPC ........ *H01L 21/4853* (2013.01); *H01L 21/561* (2013.01); *H01L 21/565* (2013.01); *H01L 23/3121* (2013.01); *H01L 23/49811* (2013.01); *H01L 23/60* (2013.01); *H01L 24/81* (2013.01); *H01L 24/97* (2013.01); *H01L 25/0652* (2013.01); *H01L 25/50* (2013.01); *H01L 2224/81815* (2013.01); *H01L 2924/1532* (2013.01)

(58) Field of Classification Search
None
See application file for complete search history.

(56) References Cited

U.S. PATENT DOCUMENTS

| | | | |
|---|---|---|---|
| 9,859,232 B1 | 1/2018 | Chiang et al. | |
| 10,872,879 B2 | 12/2020 | Kim et al. | |
| 2016/0240493 A1* | 8/2016 | Lee | H01L 23/3128 |
| 2018/0134546 A1* | 5/2018 | Oh | H01L 23/315 |
| 2018/0323170 A1* | 11/2018 | Kim | H01L 21/56 |
| 2021/0296198 A1* | 9/2021 | Im | H01L 23/552 |

\* cited by examiner

*Primary Examiner* — Jay C Chang
(74) *Attorney, Agent, or Firm* — Brian M. Kaufman; Robert D. Atkins; PATENT LAW GROUP: Atkins and Associates, P.C.

(57) ABSTRACT

A semiconductor device has a substrate and a first component disposed over a first surface of the substrate. A connector is disposed over the first surface of the substrate. A first encapsulant is deposited over the first component while the connector remains outside of the first encapsulant. A shielding layer is formed over the first encapsulant while the connector remains outside of the shielding layer. A second component is disposed over a second surface of the substrate. A solder bump is disposed over the second surface of the substrate. A second encapsulant is deposited over the second surface of the substrate. An opening is formed through the second encapsulant to expose the solder bump. A solder ball is disposed in the opening. The solder ball and solder bump are reflowed to form a combined solder bump.

19 Claims, 14 Drawing Sheets

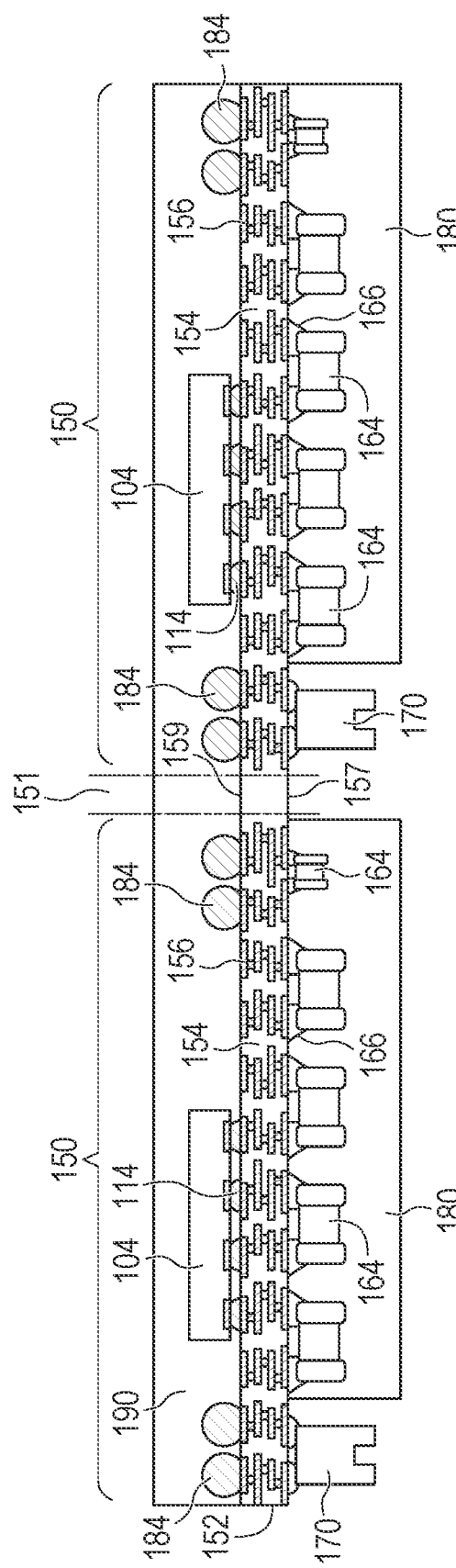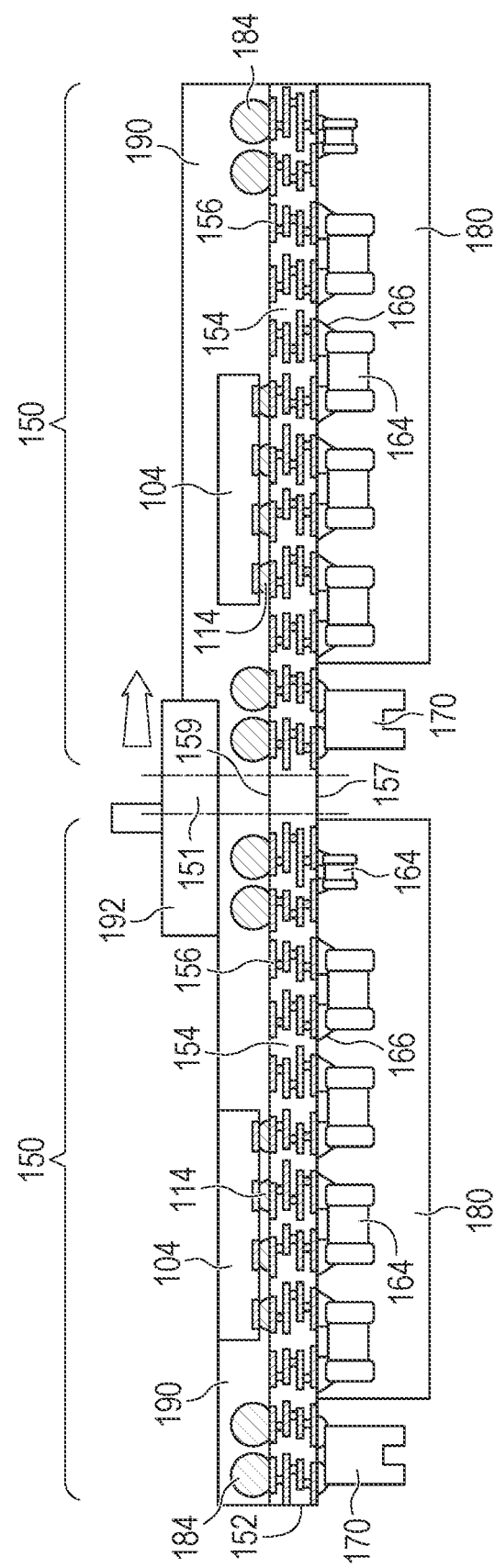

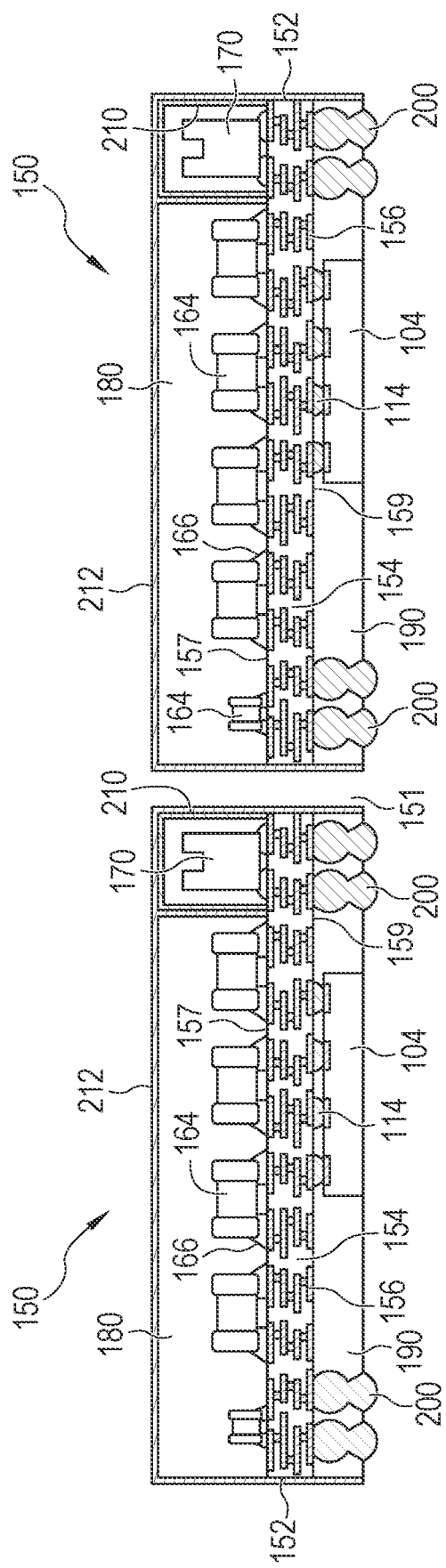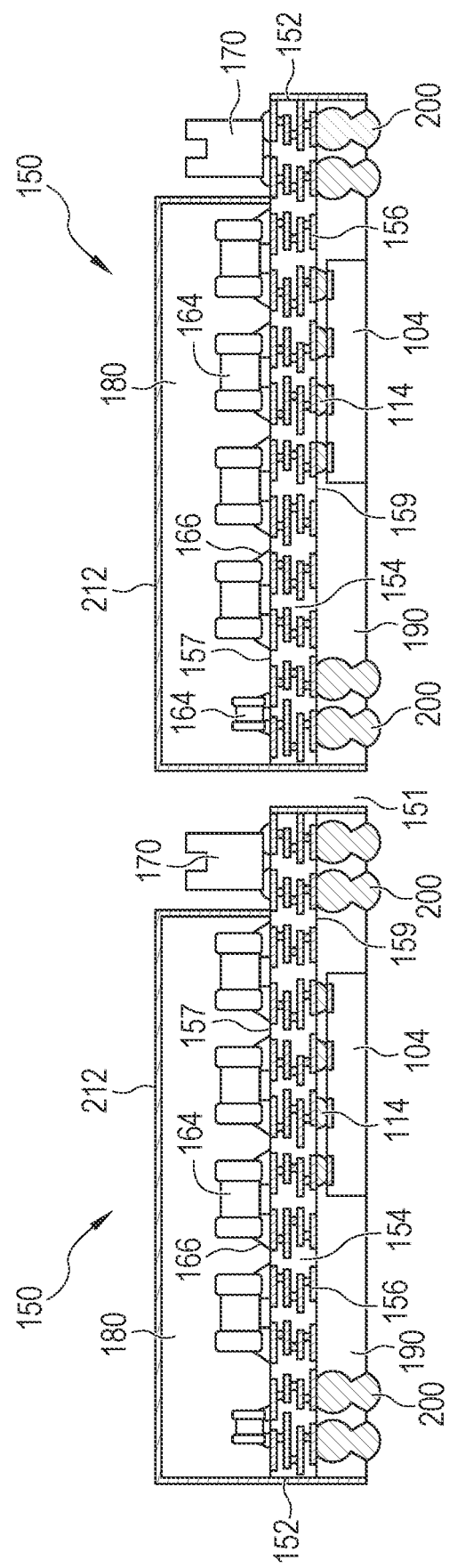
FIG. 2o
FIG. 2p

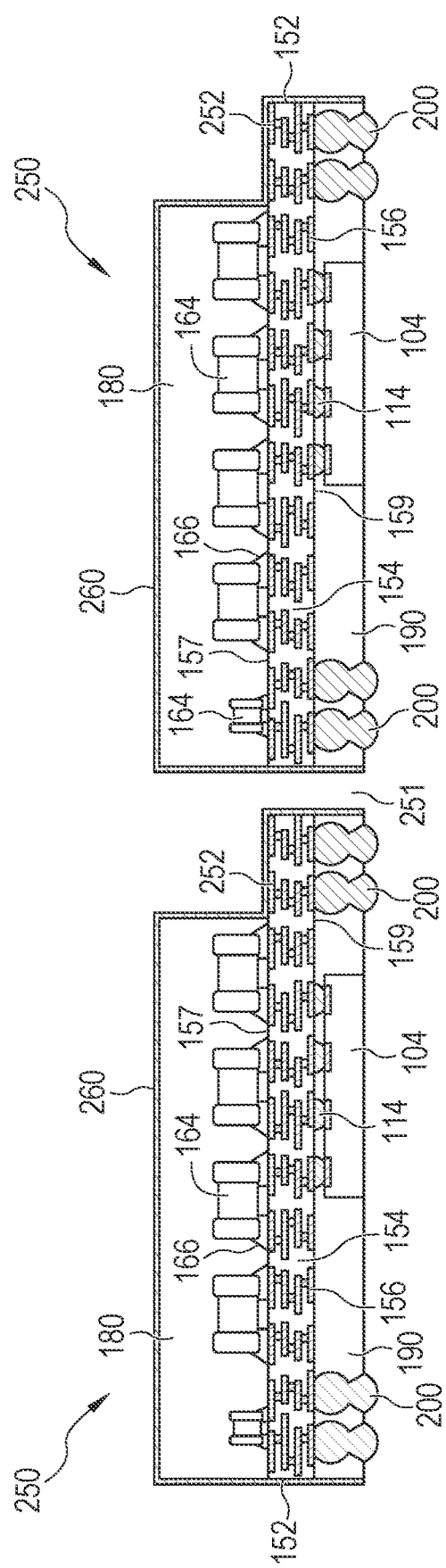
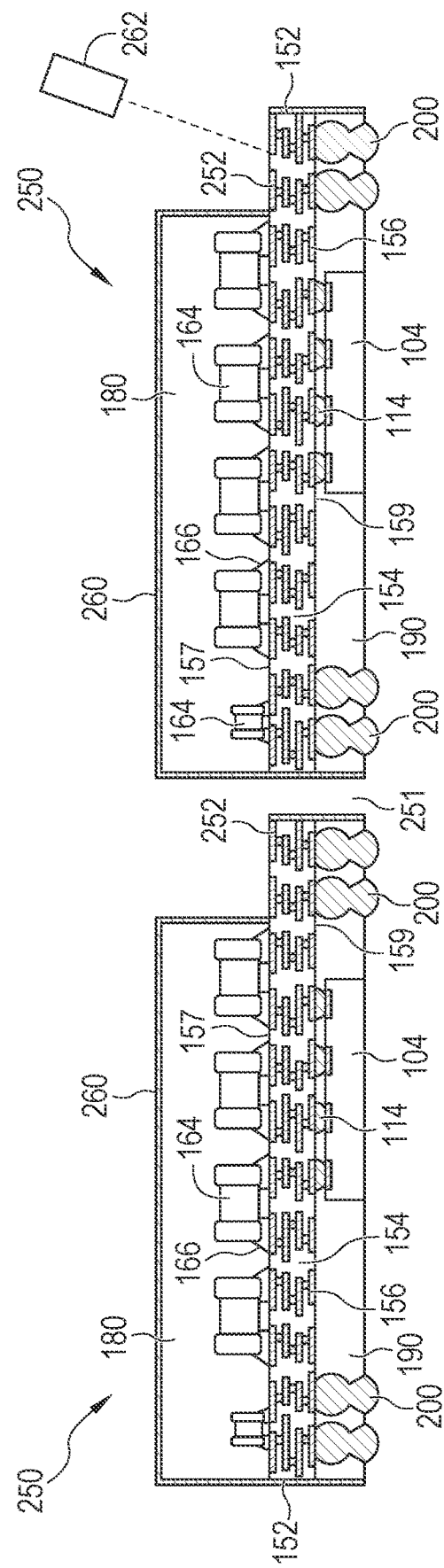
FIG. 3c
FIG. 3d

US 11,887,863 B2

DOUBLE-SIDED PARTIAL MOLDED SIP MODULE

FIELD OF THE INVENTION

The present invention relates in general to semiconductor devices and, more particularly, to double-sided partial molded System-in-Package (SiP) modules and methods of making the same.

BACKGROUND OF THE INVENTION

Semiconductor devices are commonly found in modern electronic products. Semiconductor devices perform a wide range of functions such as signal processing, high-speed calculations, transmitting and receiving electromagnetic signals, controlling electronic devices, transforming sunlight to electricity, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

System-in-Package SiP modules are a type of semiconductor package that integrates several components in a single package. One method of reducing the footprint of SiP modules is to mount components on two sides of a package substrate. Double-sided SiP modules allow more components to be included in a fixed footprint. Market forces are constantly pushing SiP modules toward smaller footprints and lower thicknesses. Encapsulating components on both sides of the substrate can present challenges as SiP module size is reduced. Therefore, a need exists for double-sided SiP modules, and improved methods of making SiP modules, that can be scaled to smaller sizes while retaining advanced features required by the marketplace.

BRIEF DESCRIPTION OF THE DRAWINGS

FIGS. 3a-3e illustrate an alternative method of forming double-sided SiP modules.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental protection. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contacts within the package. The electrical connections can be made with conductive layers, bumps, stud bumps, conductive paste, bond wires, or other suitable interconnect structure. An encapsulant or other molding material is deposited over the package to provide physical support and electrical isolation. The finished package is then inserted into an electrical system and the functionality of the semiconductor device is made available to the other system components.

Figure 1A:
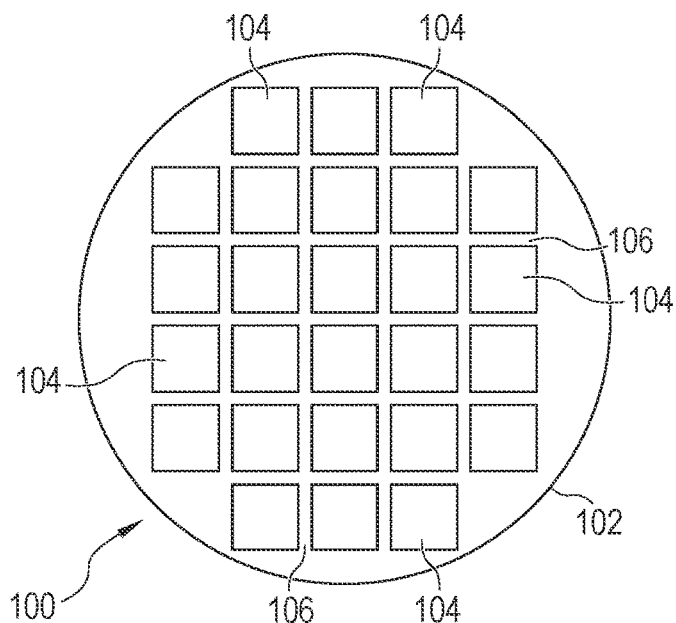
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
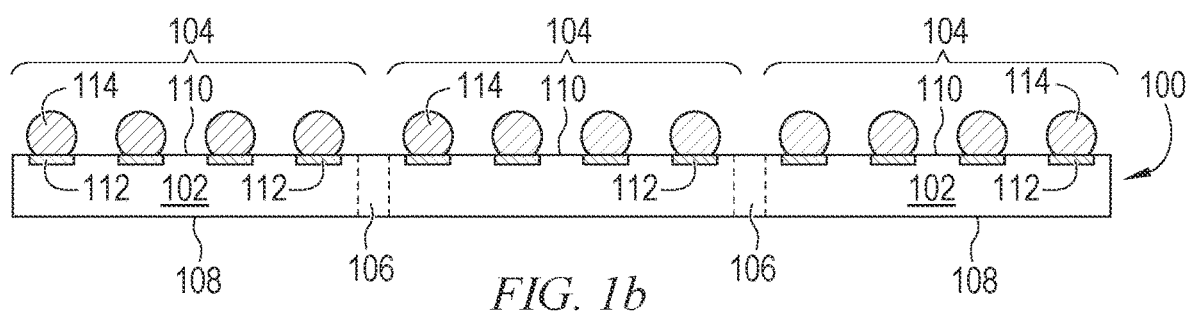

FIG. 1B shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as digital signal processor (DSP), power amplifier, application specific integrated circuits (ASIC), memory, or other signal processing circuit. Semiconductor die 104 may also contain IPDs, such as inductors, capacitors, and resistors, for RF signal processing.

An electrically conductive layer 112 is formed over active surface 110 using PVD, CVD, electrolytic plating, electroless plating process, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

An electrically conductive bump material is deposited over conductive layer 112 using an evaporation, electrolytic plating, electroless plating, ball drop, or screen printing process. The bump material can be Al, Sn, Ni, Au, Ag, lead (Pb), bismuth (Bi), Cu, solder, combinations thereof, or other suitable conductive materials with an optional flux solution. For example, the bump material can be eutectic Sn/Pb, high-lead solder, or lead-free solder. The bump material is bonded to conductive layer 112 using a suitable attachment or bonding process. In one embodiment, the bump material is reflowed by heating the material above its melting point to form balls or bumps 114. In one embodiment, bump 114 is formed over an under-bump metallization (UBM) having a wetting layer, barrier layer, and adhesion layer. Bump 114 can also be compression bonded or thermocompression bonded to conductive layer 112. Bump 114 represents one type of interconnect structure that can be formed over conductive layer 112. The interconnect structure can also use bond wires, conductive paste, stud bump, micro bump, or other electrical interconnect.

Figure 1C:
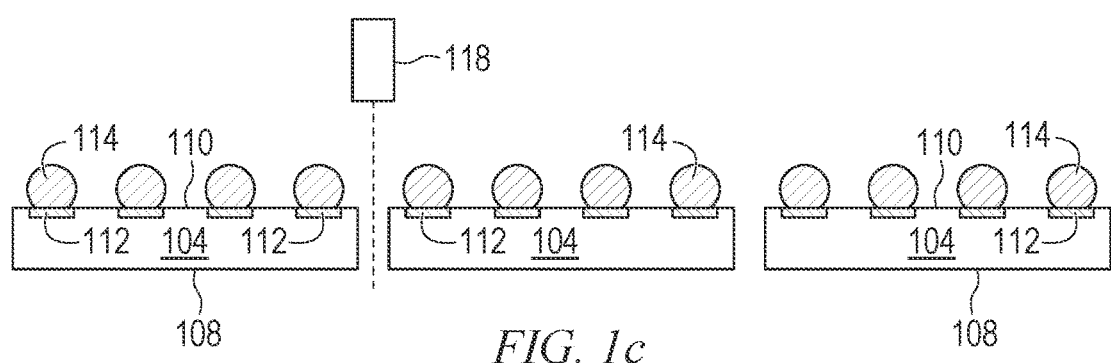

In FIG. 1c, semiconductor wafer 100 is singulated through saw street 106 using a saw blade or laser cutting tool 118 into individual semiconductor die 104. The individual semiconductor die 104 can be inspected and electrically tested for identification of known-good die (KGD) post singulation.

Figure 2A:
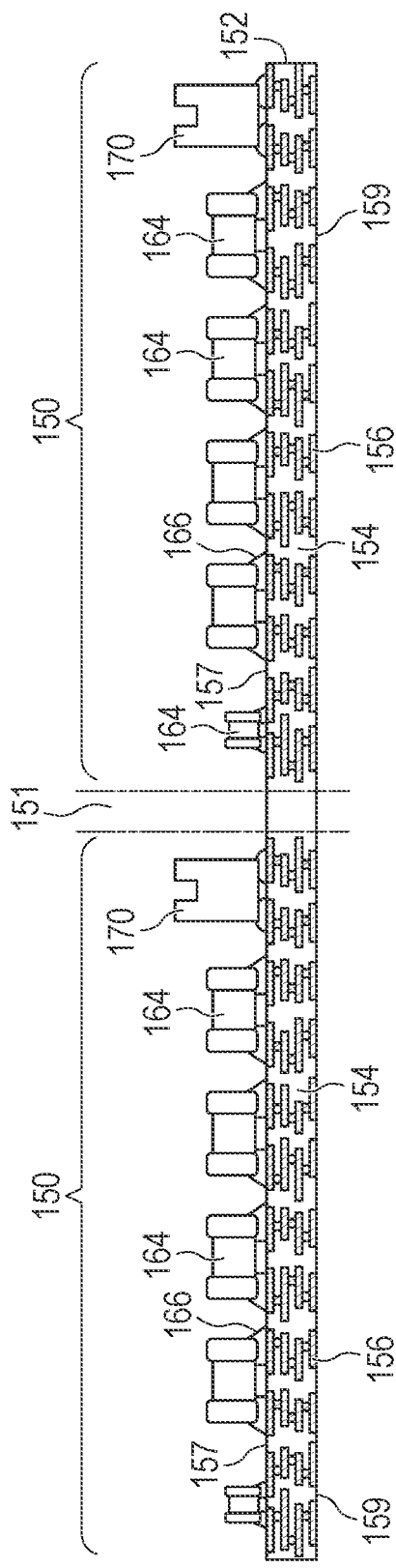
FIGS. 2a-2p illustrate forming double-sided SiP modules.

FIGS. 2a-2p illustrate forming double-sided SiP modules with semiconductor die 104. FIG. 2a is a partial cross-sectional view of a panel of SiP devices 150 separated by saw streets 151 in the early stages of manufacturing. Two SiP devices 150 are illustrated, but hundreds or thousands of SiP device are commonly formed in a single panel using the same steps described herein. Substrate 152 is used as a base for forming SiP modules 150. Substrate 152 includes one or more insulating layers 154 interleaved with one or more conductive layers 156.

Insulating layer 154 is a core insulating board in one embodiment, with conductive layers 156 patterned over the top and bottom surfaces, e.g., a copper-clad laminate substrate. Conductive layers 156 also include conductive vias electrically coupled through insulating layers 154. Substrate 152 can include any number of conductive and insulating layers interleaved over each other. A solder mask or passivation layer can be formed over either side of substrate 152. Any suitable type of substrate or leadframe is used for substrate 152 in other embodiments.

Any components desired to implement the intended functionality of SiP devices 150 are mounted to or disposed over substrate 152 and electrically connected to conductive layers 156. Substrate 152 has two major surfaces: top surface 157 and bottom surface 159. Components can be mounted onto top surface 157 and bottom surface 159 in any suitable configuration. In the illustrated embodiments, discrete components 164, e.g., resistors, capacitors, inductors, transistors, and diodes, are mounted on top surface 157 using solder paste 166. Solder paste 166 is reflowed between terminals of discrete components 164 and contact pads of conductive layers 156 on top surface 157. Semiconductor die 104 will be mounted on bottom surface 159 at a later stage. Alternatively, semiconductor die 104 or other active components could be mounted on top surface 157 and discrete components can be mounted on bottom surface 159 instead of or in addition to semiconductor die 104.

In the illustrated embodiment, semiconductor 104 is a 5G cellular transceiver and discrete components 164 form a filter network for the millimeter (mm) wave radio frequency (RF) signals that 5G uses. The state of the art for mm wave 5G is that a board-to-board (B2B) connector 170 is used to ensure signal input and output stability. B2B connector 170 allows a cable to be connected to SiP modules 150 for direct interconnection with another semiconductor package. After any desired components, including discrete components 164 and B2B connector 170, are mounted on top surface 157, a reflow step is used to melt solder paste 166 and physically attach the components. A deflux step is optionally used to clean the connections.

Figure 2B:
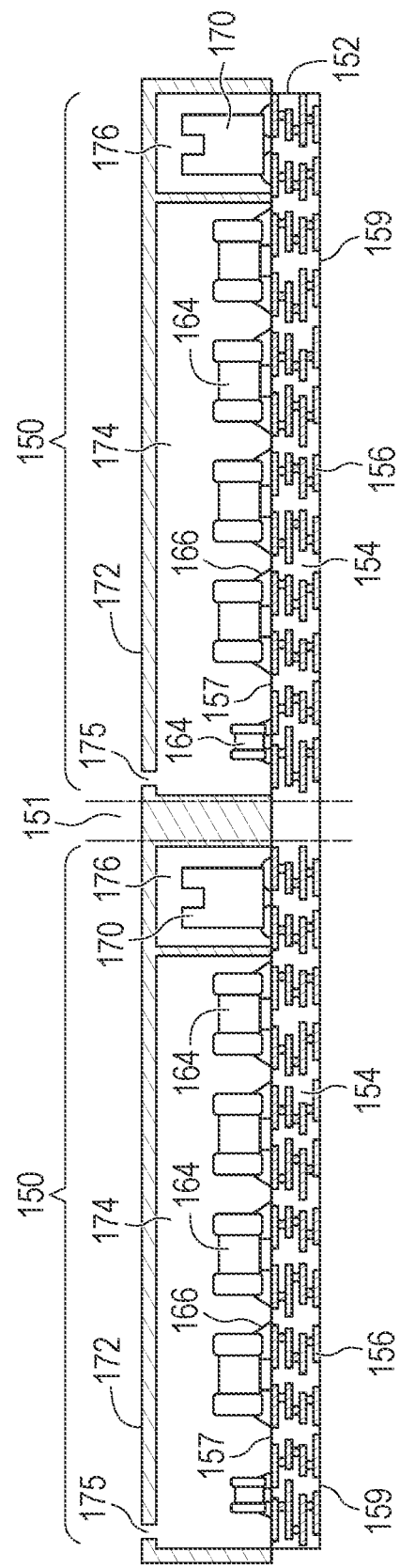

In the fully manufactured SiP module 150, discrete components 164 will need to be encapsulated for environmental protection while B2B connector 170 will need to be exposed for subsequent connection via a B2B cable. FIG. 2b illustrates a mold chase 172 with partitions used to selectively encapsulate discrete components 164 without covering B2B connector 170. A mold cavity 174 encloses the components to be encapsulated, e.g., discrete components 164, and an inlet 175 will allow the mold cavity to be filled with molding compound. A relief cavity 176 encloses B2B connector 170. Relief cavity 176 blocks the molding compound from flowing onto B2B connector 170. The walls of relief cavity 176 substantially seal off B2B connector 170 from mold cavity 174 so that the molding compound encapsulates discrete components 164 without extending to B2B connector 170.

Figure 2C:
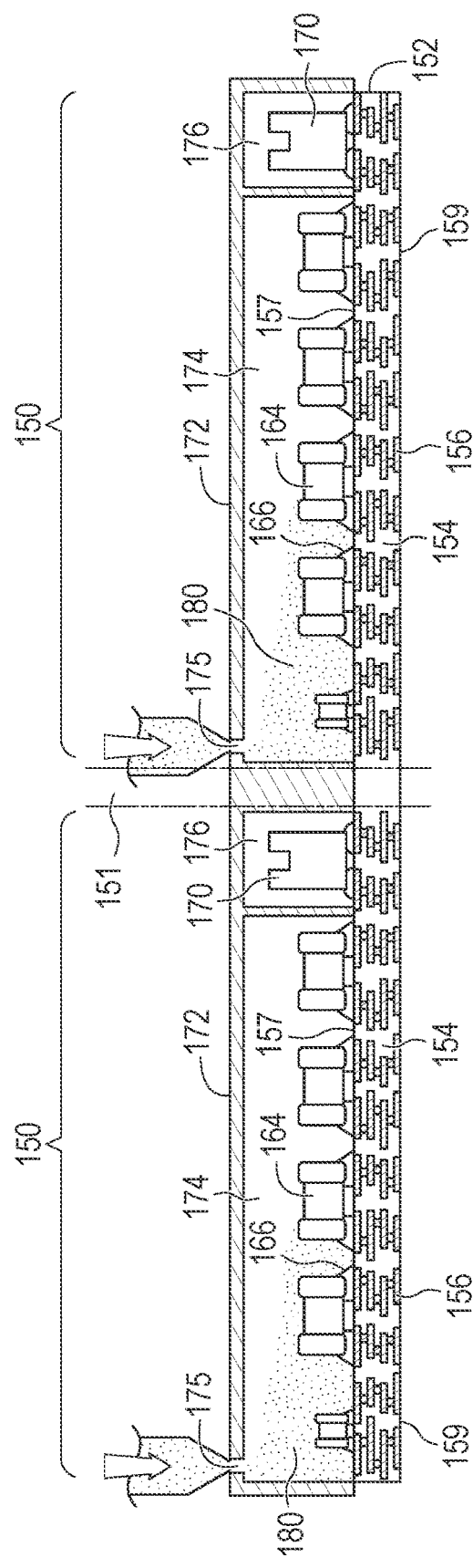

FIG. 2c shows encapsulant 180 being deposited through inlet 175 to fill mold cavity 174. Encapsulant 180 flows over, under, and around any components within mold cavity 174. For some components, a separate mold underfill can be used to ensure the area between the components and substrate 152 is filled. After mold cavity 174 is filled with encapsulant 180, the encapsulant is cured if necessary. Any suitable molding process can be used. Encapsulant 180 can be polymer composite material, such as epoxy resin, epoxy acrylate, or any suitable polymer with or without filler. Encapsulant 180 is non-conductive, provides structural support, and environmentally protects discrete components 164 from external elements and contaminants.

Figure 2D:
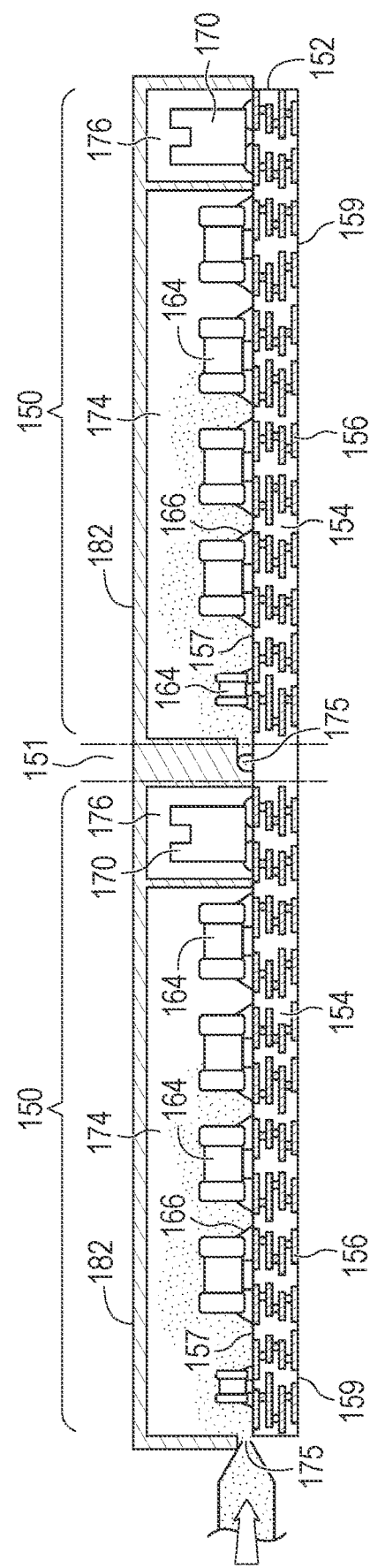

FIG. 2c illustrates top cavity encapsulation. In other embodiments, other encapsulation methods are used. As another example, FIG. 2d shows depositing encapsulant 180 via transfer molding with mold chase 182. Inlet 175 is positioned at the bottom adjacent to substrate 152.

Figure 2E:
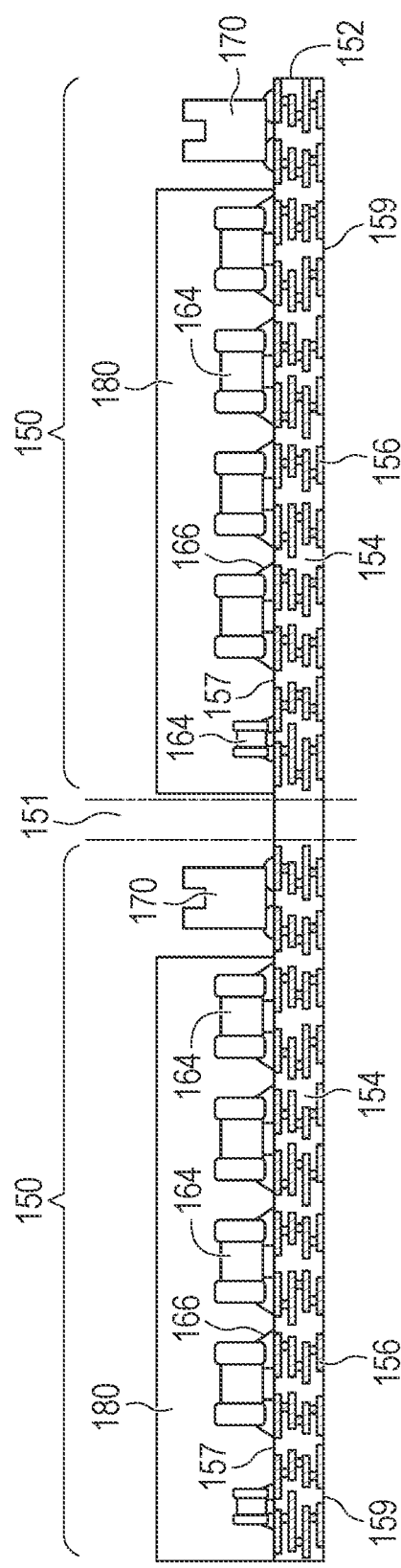

In FIG. 2e, mold chase 172 or 182 is removed to leave cured encapsulant 180 over discrete components 164 in the shape of mold cavity 174. B2B connector 170 remains exposed for later use.

Figure 2F:
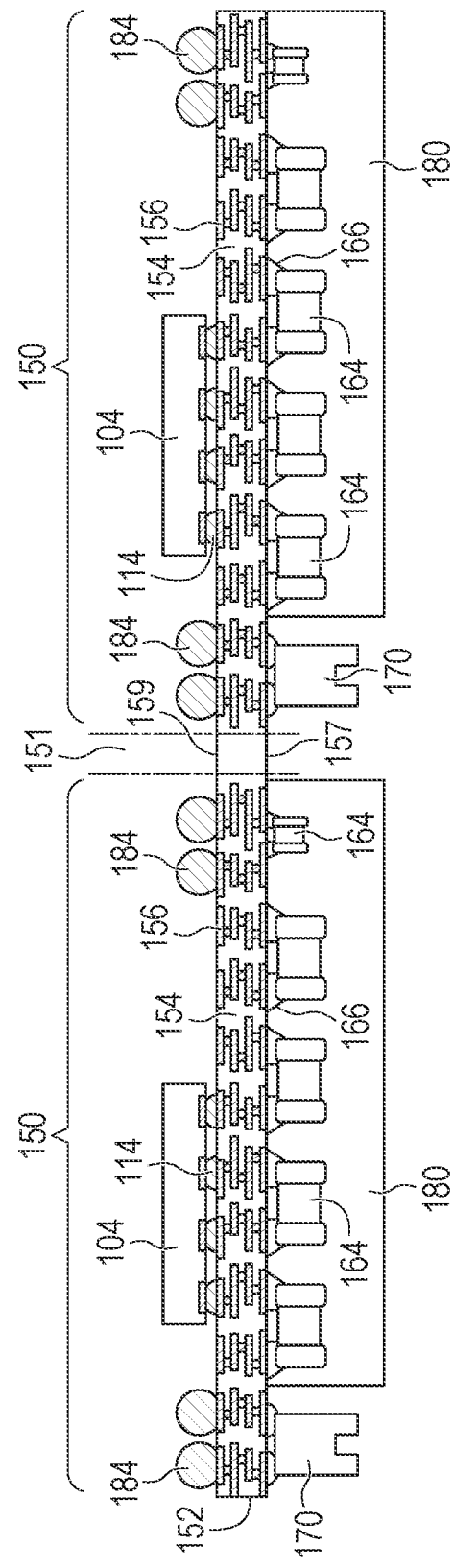

In FIG. 2f, the panel of SiP devices 150 is flipped so that bottom surface 159 of substrate 152 is oriented upward or otherwise available for processing. The panel can be flipped by transferring from a first carrier to a second carrier. Semiconductor die 104 is mounted to substrate 152 by disposing the semiconductor die on bottom surface 159 using, e.g., a pick-and-place process or machine, and then reflowing bumps 114 to physically and electrically couple the bumps to exposed contact pads of conductive layer 156. Solder bumps 184 are formed using any suitable method and of any suitable material, such as those discussed above for bumps 114 on semiconductor die 104. Any other desired electrical components can also be mounted onto bottom surface 159, e.g., additional discrete components 164, discrete active components, or integrated circuit die.

In one embodiment, after bumps 184 and die 104 are placed on bottom surface 159, a reflow step is used to melt bumps 184 and 114 and physically attach them to substrate 140. An optional deflux step cleans up the surfaces.

In FIG. 2g, a second encapsulant 190 is deposited over bottom surface 159, semiconductor die 104, and bumps 184 using a paste printing, compressive molding, transfer molding, liquid encapsulant molding, vacuum lamination, spin coating, or another suitable applicator. Encapsulant 190 can be polymer composite material, such as epoxy resin, epoxy acrylate, or any suitable polymer with or without filler. Encapsulant 190 is non-conductive, provides structural support, and environmentally protects SiP devices 150 from external elements and contaminants.

Unlike top surface 157 with B2B connector 170, bottom surface 159 is completely covered by encapsulant. Encapsulant 190 is deposited to a greater height over bottom surface 159 than back surface 108 of semiconductor die 104, and also greater than the height of bumps 184 over bottom surface 159. Back surface 108 of semiconductor die 104 is covered by encapsulant 190. Bumps 184 are completely covered by encapsulant 190 as well.

In FIG. 2h, a grinder 192 is used to planarize encapsulant 190 to a desired thickness. Grinder 192 removes the material of encapsulant 190 to reduce the encapsulant's thickness. Optionally, encapsulant 190 is thinned until semiconductor die 104 is exposed. A portion of semiconductor die 104 can be removed in the planarization process to ensure back surface 108 of the die is coplanar with the back surface of encapsulant 190. Bumps 184 remain covered by encapsulant 190.

Figure 2I:
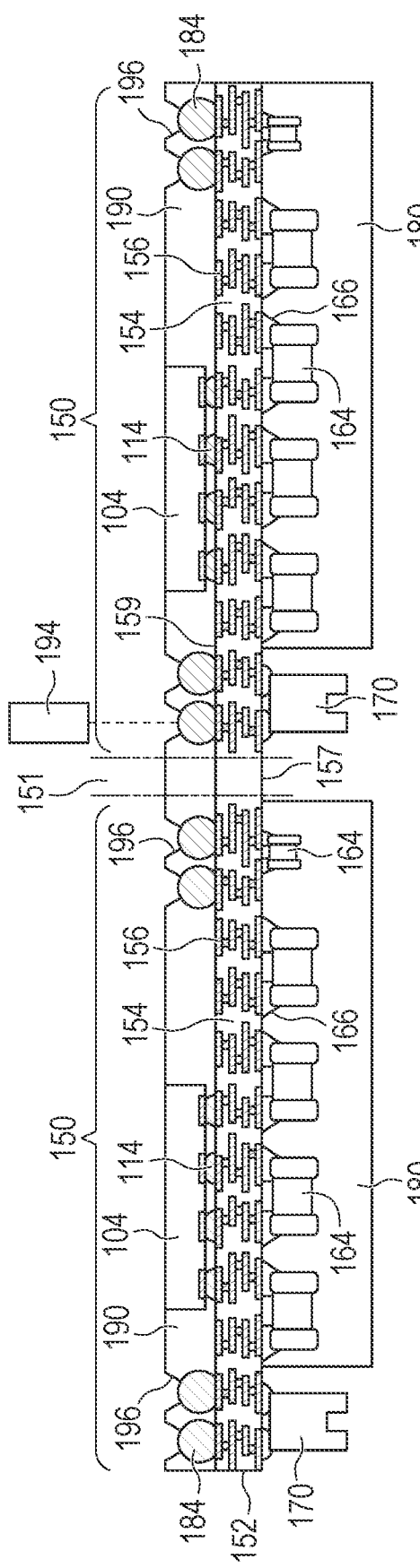

In FIG. 2i, a laser 194 is used to drill through encapsulant 190 to form openings 196 exposing bumps 184. Laser 194 emits energy as a laser beam that removes the material of encapsulant 190 wherever the laser beam hits the encapsulant. Laser 194 is mounted to a jig and moved over each bump 184 individually to expose each respective bump. In other embodiments, multiple lasers 194 are used in parallel. An opening 196 is formed for each bump 184. In some embodiments, openings 196 are formed using chemical etching, mechanical drilling, or another suitable means rather than using laser 194.

Figure 2J:
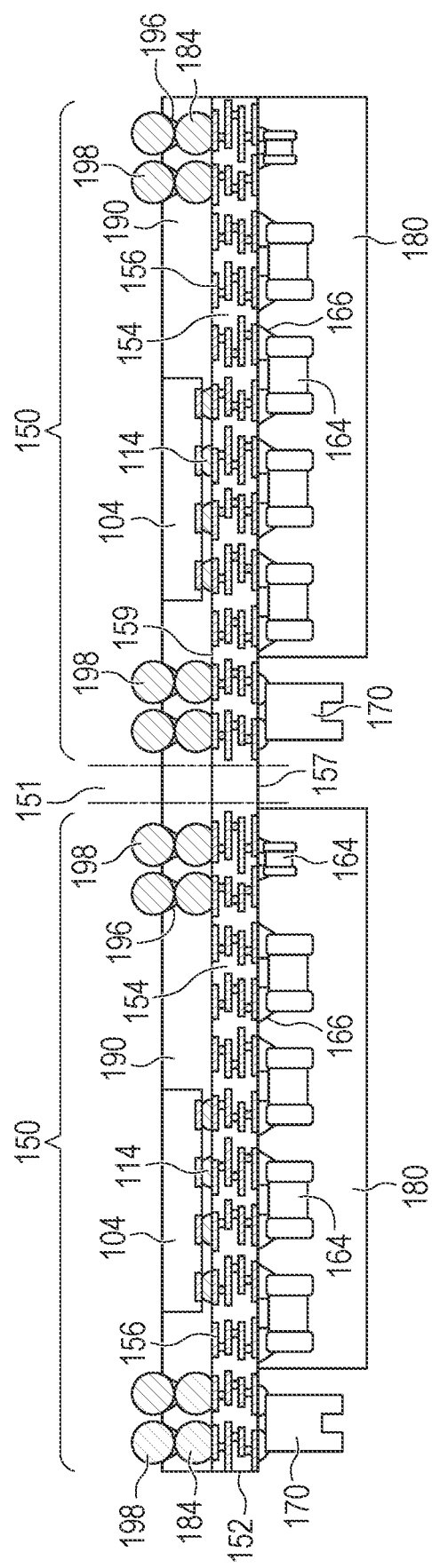

In FIG. 2j, solder balls 198 are disposed into openings 196 on bumps 184. Balls 198 may contact bumps 184 or may be held above bumps 184 by the sidewalls of openings 196. Balls 198 are disposed using any suitable ball drop or placement mechanism. Each opening 196 has a solder ball 198 placed thereon, stacked on or over a respective solder bump 184.

Figure 2K:
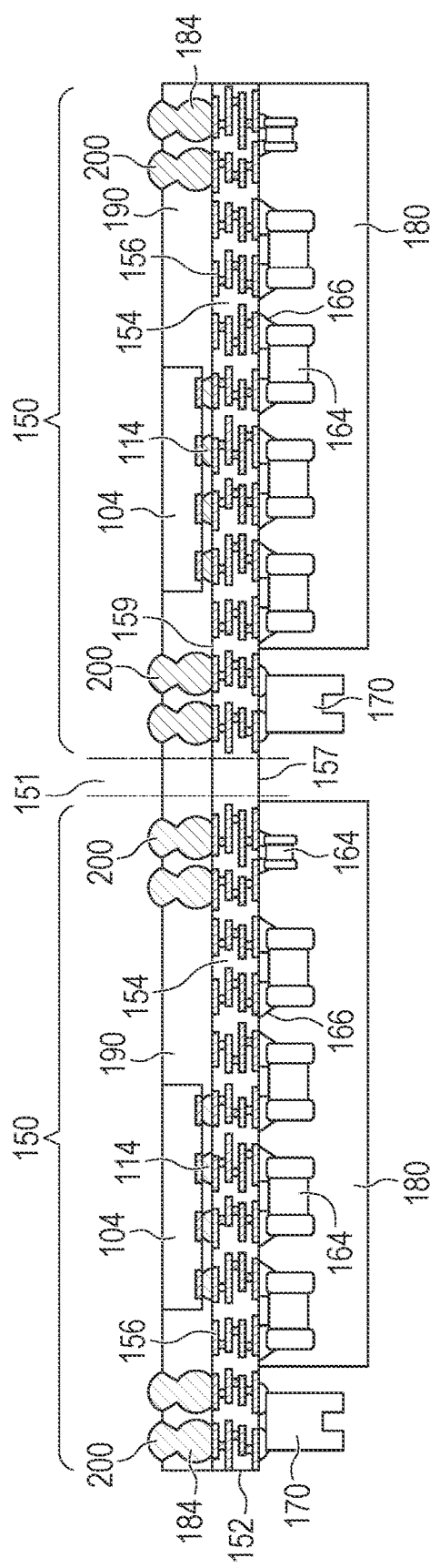

FIG. 2k shows solder balls 198 and solder bumps 184 reflowed into a combined solder bump 200. Solder bumps 200 include the solder material of solder bumps 184 and solder balls 198 melted into a single mass of solder by heating the solder material to a temperature above the solder's melting point. Solder bumps 200 include a continuous solder structure with a uniform material composition from contact pads of conductive layer 156 on bottom surface 159 to above the opposite surface of encapsulant 190. Bumps 200 extend completely through the thickness of encapsulant 190. After reflowing bumps 184 and balls 198 into bumps 200, an optional deflux step is performed. The panel of SiP modules 150 is singulated along saw streets 151 in FIG. 2l using a saw blade or laser cutting tool 204 to separate the individual modules from each other.

FIGS. 2m-2p show formation of a shielding layer over encapsulant 180. The panel is optionally flipped either before or after singulation to provide access to the upper encapsulant 180. Alternatively, a shielding layer can be formed as illustrated but prior to processing on bottom surface 159 to reduce the number of times the panel is flipped during manufacturing.

Figure 2L:
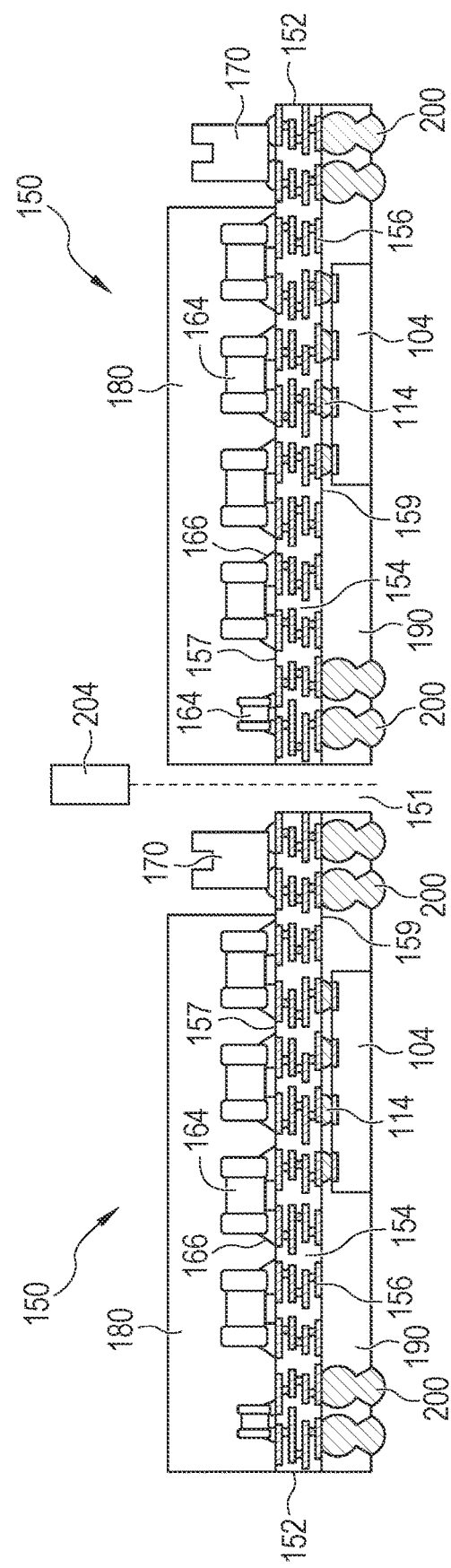
Figure 2M:
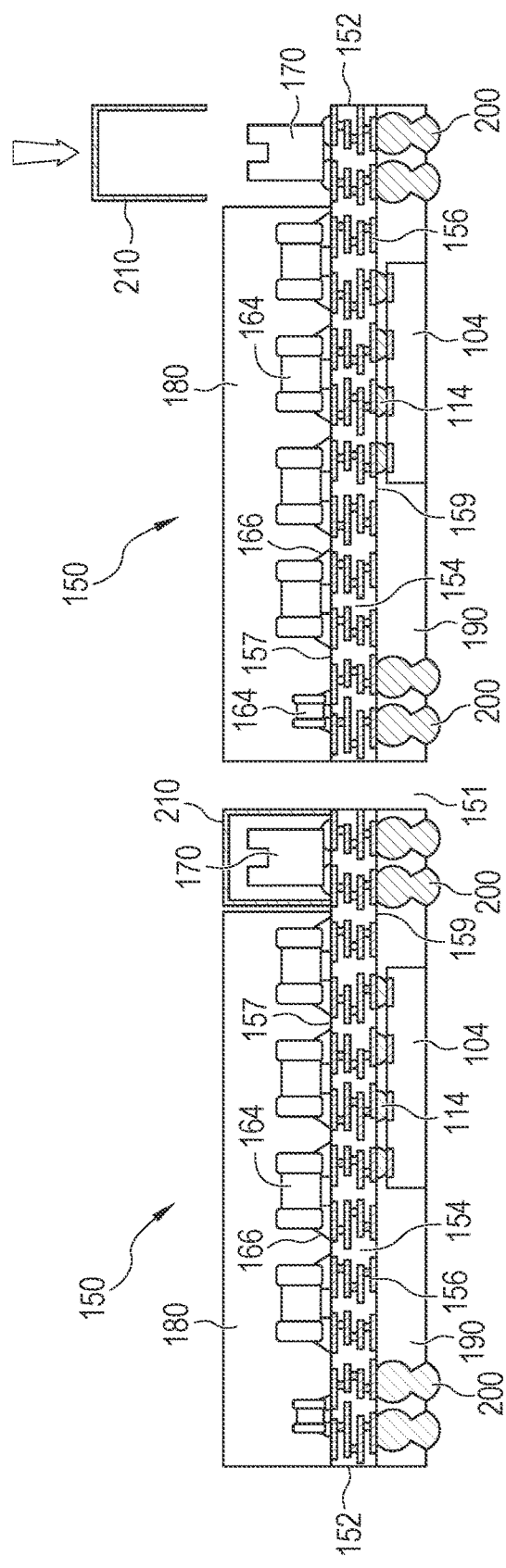

In FIG. 2m, a can 210 is disposed over B2B connector 170 to protect the B2B connector during shielding layer formation. Can 210 contacts top surface 157 around B2B connector 170 to block sputtered metal from creating an electrical connection to the B2B connector.

Figure 2N:
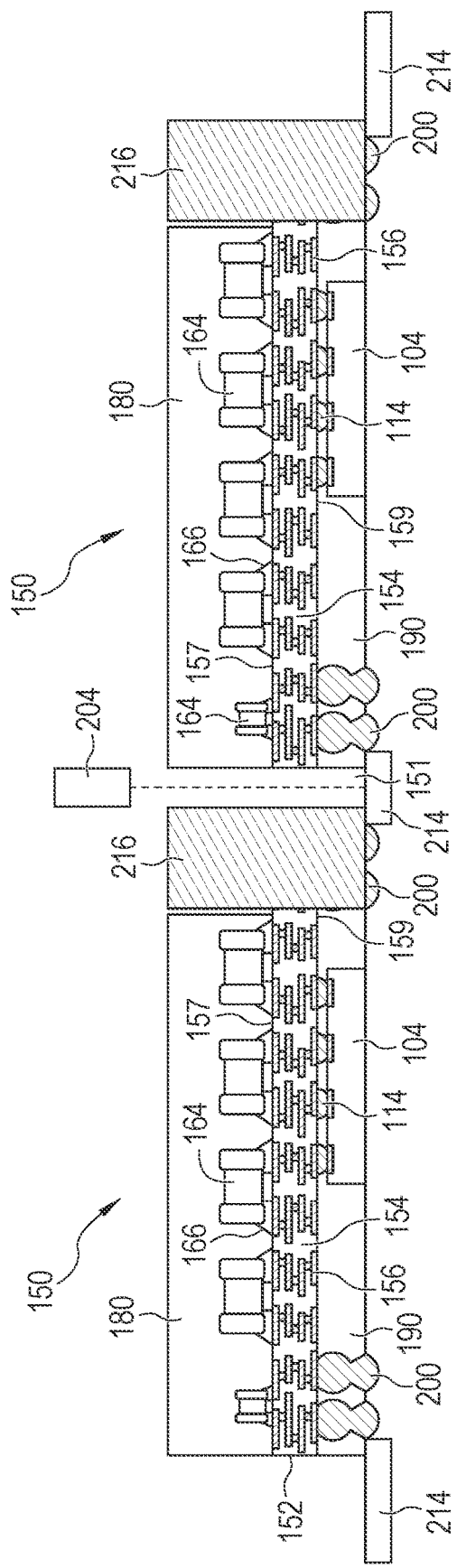

FIG. 2n shows an alternative to can 210. SiP modules 150 are disposed on openings in a film carrier 214, e.g., using a pick and place process or machine. SiP modules 150 are placed with the edges of the SiP modules on film carrier 214 and solder bumps 200 within the openings. In other embodiments, bumps 200 can be placed on film carrier 214. Mask 216 are placed over the ends of SiP modules 150 to cover B2B connector 170. Masks 216 rest on film carrier 216 around SiP modules 150. Film carrier 216 can include an adhesive to keep SiP modules 150 and masks 216 in place. The side of masks 216 oriented toward a respective encapsulant 180 is shorter to form a lip that extends over substrate 152 between the encapsulant and B2B connector 170.

With cans 210 or masks 216 in place over B2B connectors 170, a shielding layer 212 is formed over upper encapsulant 180 in FIG. 2o. Shielding layer 212 is formed conformally over SiP devices 150 and completely covers top and side surfaces of encapsulant 180 and can 210. Shielding layer 212 can physically contact conductive layers 156 exposed at side surfaces of substrate 152 to ground the shielding layer. Shielding layer 212 is formed by spray coating, plating, sputtering, or any other suitable metal deposition process. Shielding layer 212 can be formed from copper, aluminum, iron, or any other suitable material for EMI shielding. A gap typically remains between shielding layer 212 on can 210 and encapsulant 180 to make the can easier to subsequently remove.

In some embodiments, SiP modules 150 are disposed on a carrier with an optional thermal release or interface layer during singulation in FIG. 2l. The singulated SiP devices 150 remain on the same carrier for application of shielding layer 212. Therefore, the space between adjacent SiP devices 150 during forming of shielding layer 212 is equivalent to the width of the saw kerf of cutting tool 204. The thickness of shielding layer 212 is low enough that the shielding layers of adjacent SiP devices 150 do not touch each other and the packages remain singulated on the carrier. In other embodiments, SiP devices 150 are disposed on a separate carrier after singulation and prior to forming shielding layer 212.

In FIG. 2p, cans 210 or masks 216 are removed along with the portions of shielding layer 212 formed on the cans or masks. Shielding layer 212 remains completely covering every exposed surface of encapsulant 180, including the top and all four side surfaces. All exposed surfaces of encapsulant 180 are coated in the conductive material in forming shielding layer 212. Shielding layer 212 is not formed on B2B connector 170 to leave the connector exposed for subsequent use.

SiP modules 150 in FIG. 2p are completed units, ready to be packaged for delivery to a customer that will integrate the SiP modules into larger electronic devices. SiP modules 150 include a semiconductor die 104, discrete components 164, and any other desired electrical components packaged on two opposing surfaces of substrate 152. Components on both top surface 157 and bottom surface 159 are encapsulated for environmental protection. Components on top surface 157 are shielded by shielding layer 212 surrounding side surfaces and the top surface of encapsulant 180. Semiconductor die 104 and other components on bottom surface 159 also benefit from shielding layer 212, although the bottom components are not as tightly surrounded by the shielding layer as discrete components 164.

B2B connector 170 remains exposed from and outside of both encapsulant 180 and shielding layer 212 for high-speed signal input and output (I/O). Bumps 200 also remain exposed for mounting of SiP module 150 to a larger substrate and additional system integration. In one common scenario, B2B connector 170 is used to transmit high bandwidth data signals between SiP module 150 and another component while bumps 200 are used to provide power, debug output, and other slower data I/O. Bumps 200 also provide a mechanical connection to the underlying system substrate by reflowing the solder material onto contact pads.

Figure 3A:
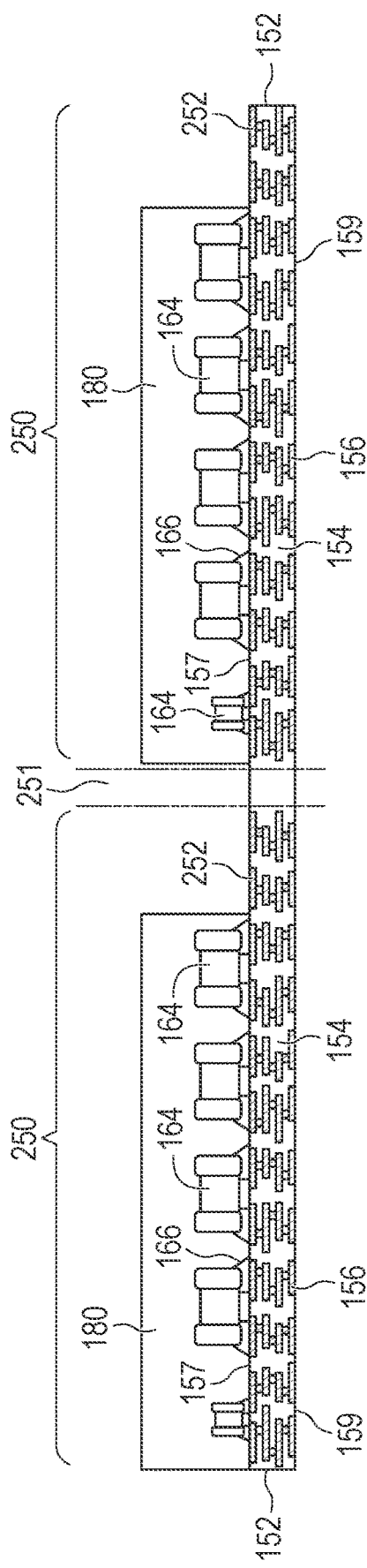

FIGS. 3a-3e show an alternative process flow for forming SiP modules 250 with double-sided encapsulation, shielding, and an exposed B2B connector. FIG. 3a begins with a panel in a similar state as shown in FIG. 2e, except that B2B connector 170 has not been mounted onto substrate 152 yet. Instead, contact pads 252 are left exposed for later mounting of B2B connector 170. Molding of encapsulant 180 can use the same mold chase 172 or 182 from FIGS. 2b-2d or a different mold without relief cavity 176 can be used. The mold can be solid instead of having a cavity for B2B connector 170.

Figure 3B:
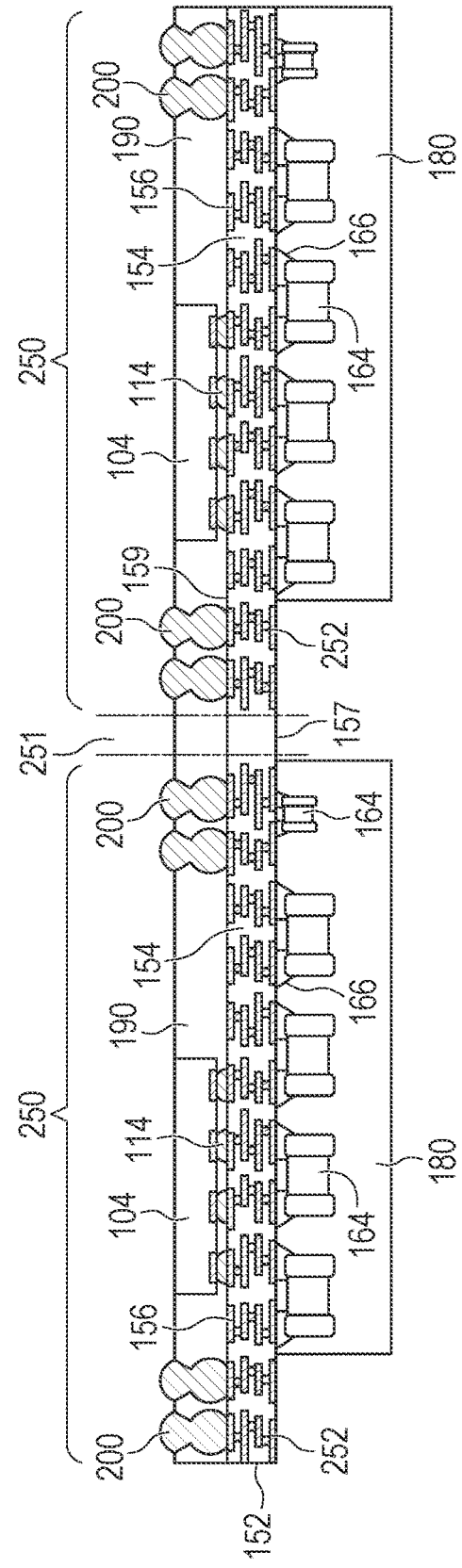

FIG. 3b illustrates SiP modules 250 after the steps from FIGS. 2f-2k above are performed. Bumps 200 are provided extending through encapsulant 190 for mounting to a system substrate. In FIG. 3c, SiP modules 250 are flipped and singulated through saw street 251. Shielding layer 260 is formed over SiP modules 250 in a similar manner to shielding layer 212 above. Shielding layer 260 is formed completely covering all top and side surfaces of encapsulant 180 and substrate 152, including contact pads 252 that were not covered by encapsulant 180.

Figure 3E:
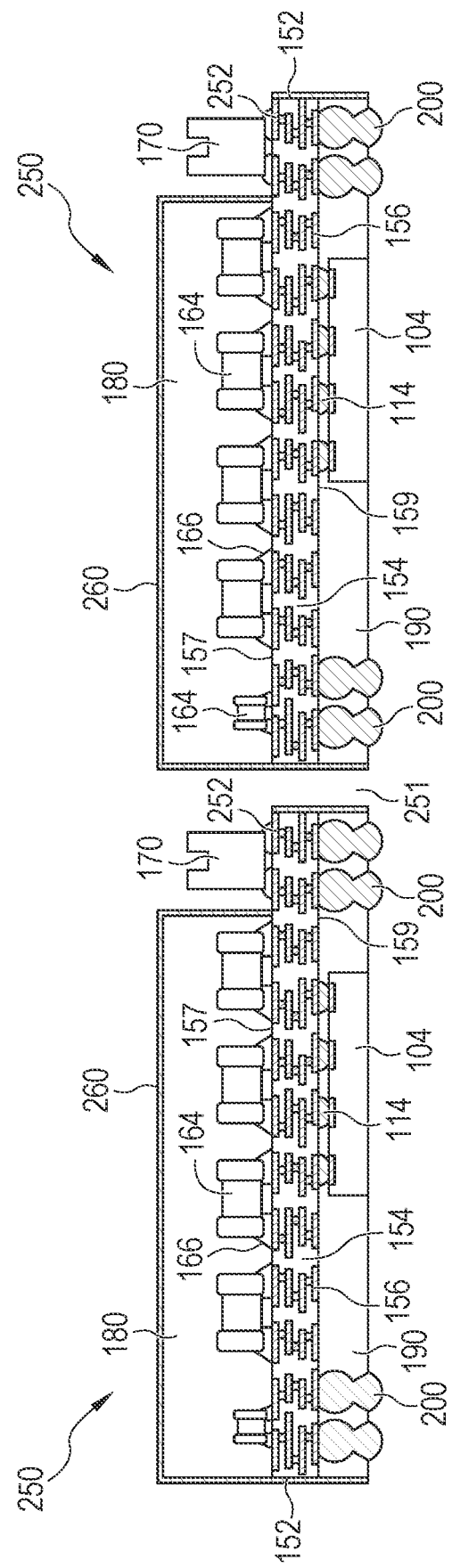

In FIG. 3d, a laser 262 is used to remove shielding layer 260 from over contact pads 252. The portion of shielding layer 260 is removed by sputter peeling via laser ablation in one embodiment. Other types of etching, e.g., chemical or mechanical, are used in other embodiments to remove shielding layer 260 from over contact pads 250. In FIG. 3e, B2B connectors 170 are picked and placed onto contact pads 252 to electrically connect the B2B connectors to semiconductor die 104, discrete components 164, and any other electrical components mounted on substrate 152.

Figure 4A:
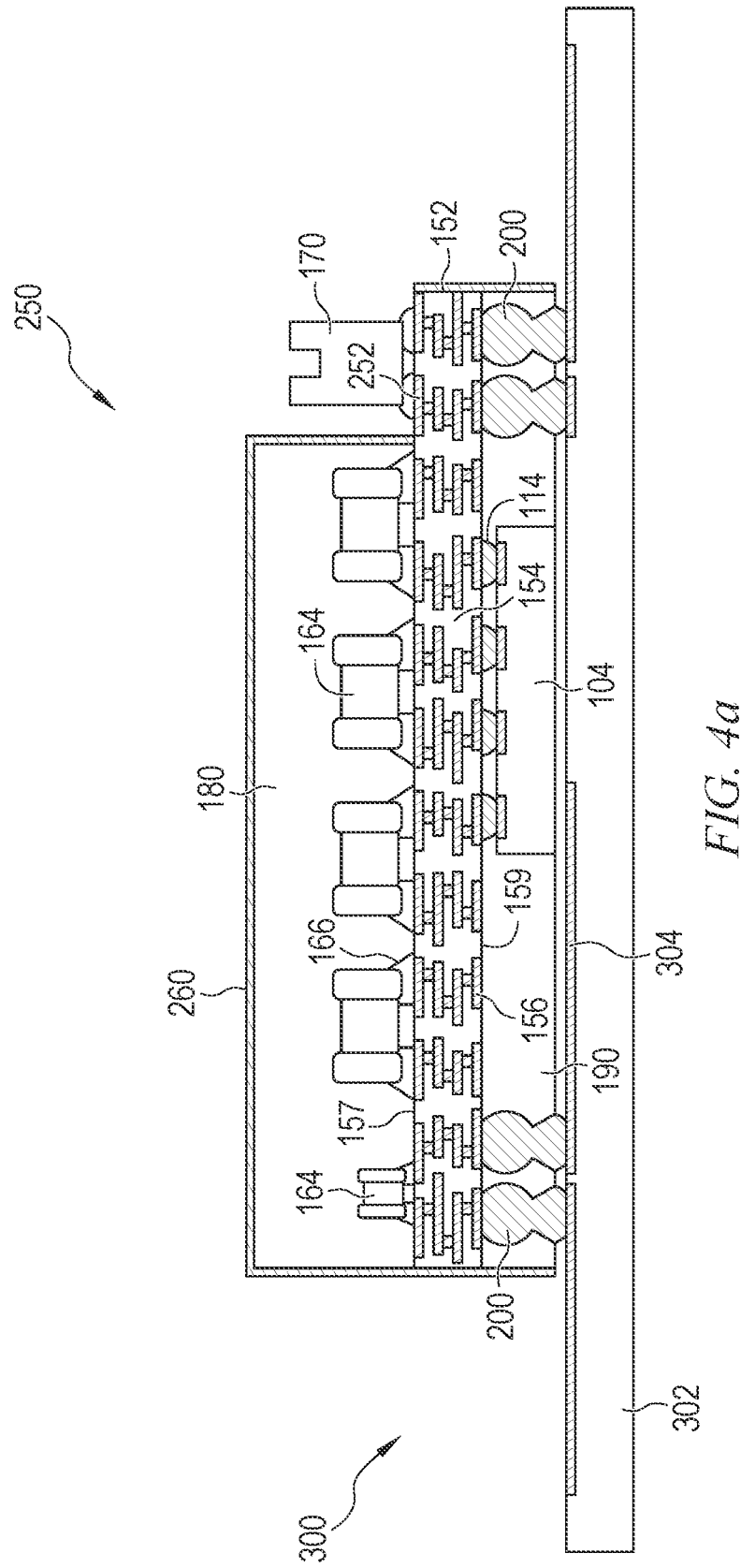
FIGS. 4a and 4b illustrate integrating the SiP modules into an electronic device.
Figure 4B:
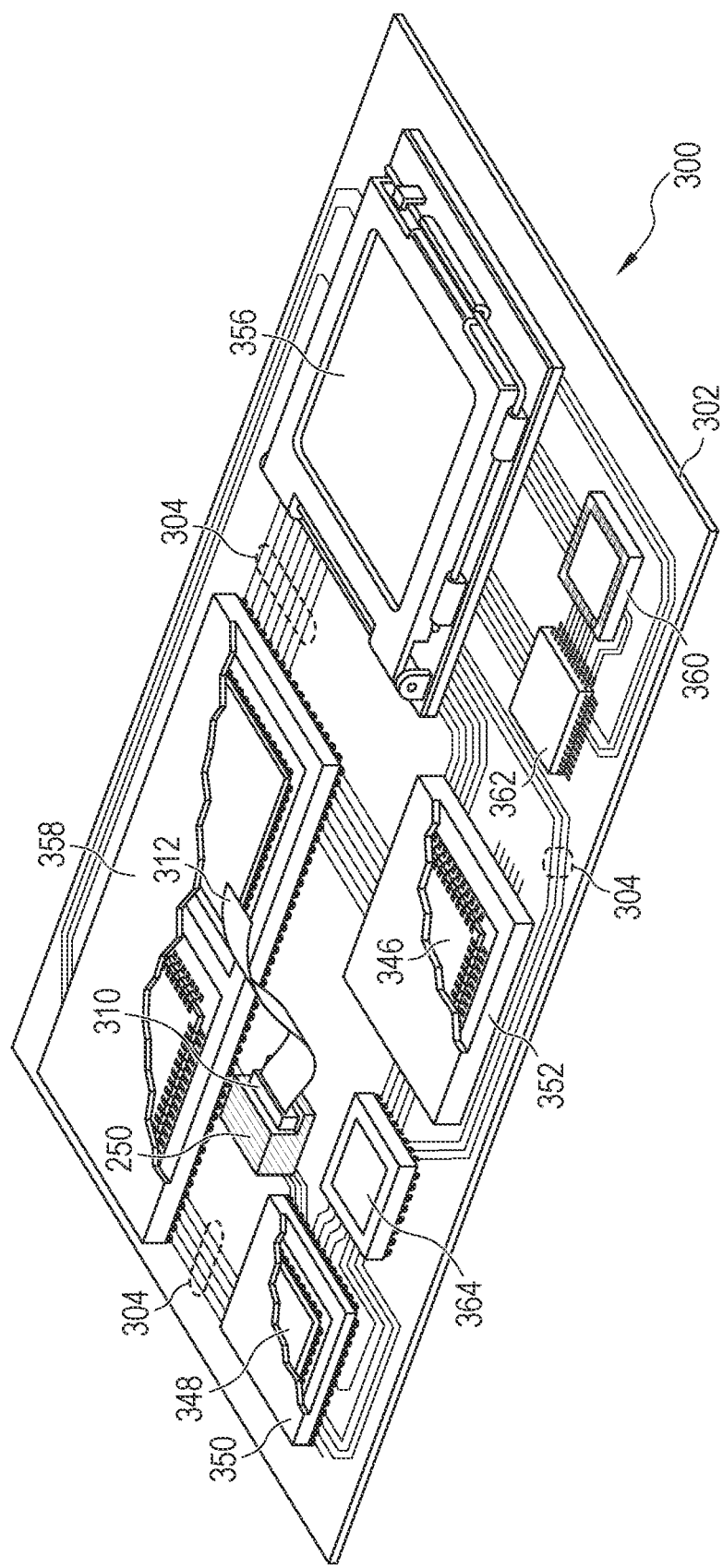

FIGS. 4a and 4b illustrate incorporating the above-described SiP modules, e.g., SiP module 250 with shielding layer 260, into an electronic device 300. FIG. 4a illustrates a partial cross-section of SiP module 250 mounted onto a printed circuit board (PCB) or other substrate 302 as part of electronic device 300. Bumps 200 are reflowed onto conductive layer 304 of PCB 302 to physically attach and electrically connect SiP module 250 to the PCB. In other embodiments, thermocompression or other suitable attachment and connection methods are used. In some embodiments, an adhesive or underfill layer is used between SiP module 250 and PCB 302. Semiconductor die 104 is electrically coupled to conductive layer 304 through substrate 152 and bumps 200.

FIG. 4b illustrates electronic device 300 including PCB 302 with a plurality of semiconductor packages mounted on a surface of the PCB, including SiP module 250 with shielding layer 260 and B2B connector 170. A ribbon cable 312 with connector 310 is plugged into B2B connector 170 to electrically couple another device to the components in SiP module 250. Connector 310 is configured to interface with B2B connector 170 so that ribbon cable 312 can conduct electrical signals to and from SiP module 250 through the ribbon cable. Ribbon cable 312 can be used to connect SiP module 250 to PCB 302, another package on PCB 302, another PCB of the same or different electronic device, another package on another PCB, another electronic device, testing equipment, etc. Other types of cable or conductor, such as coaxial cable or twisted-pair cables, can be used instead of a ribbon cable. Ribbon cable 312 is connected to semiconductor die 104 and discrete components 164 through substrate 152.

Electronic device 300 can have one type of semiconductor package, or multiple types of semiconductor packages, depending on the application. Electronic device 300 can be a stand-alone system that uses the semiconductor packages to perform one or more electrical functions. Alternatively, electronic device 300 can be a subcomponent of a larger system. For example, electronic device 300 can be part of a tablet computer, cellular phone, digital camera, communication system, or other electronic device. Electronic device 300 can also be a graphics card, network interface card, or another signal processing card that is inserted into a computer. The semiconductor packages can include microprocessors, memories, ASICs, logic circuits, analog circuits, RF circuits, discrete active or passive devices, or other semiconductor die or electrical components.

In FIG. 4b, PCB 302 provides a general substrate for structural support and electrical interconnection of the semiconductor packages mounted on the PCB. Conductive signal traces 304 are formed over a surface or within layers of PCB 302 using evaporation, electrolytic plating, electroless plating, screen printing, or other suitable metal deposition process. Signal traces 304 provide for electrical communication between the semiconductor packages, mounted components, and other external systems or components. Traces 304 also provide power and ground connections to the semiconductor packages as needed.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to PCB 302. In other embodiments, a semiconductor device may only have the first level packaging where the die is mechanically and electrically mounted directly to PCB 302.

For the purpose of illustration, several types of first level packaging, including bond wire package 346 and flipchip 348, are shown on PCB 302. Additionally, several types of second level packaging, including ball grid array (BGA) 350, bump chip carrier (BCC) 352, land grid array (LGA) 356, multi-chip module (MCM) 358, quad flat non-leaded package (QFN) 360, quad flat package 362, and embedded wafer level ball grid array (eWLB) 364 are shown mounted on PCB 302 along with SiP module 250. Conductive traces 304 electrically couple the various packages and components disposed on PCB 302 to SiP module 250, giving use of the components within SiP module 250 to other components on the PCB.

Depending upon the system requirements, any combination of semiconductor packages, configured with any combination of first and second level packaging styles, as well as other electronic components, can be connected to PCB 302. In some embodiments, electronic device 300 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    providing a substrate;
    disposing a first component over a first surface of the substrate;
    disposing a board-to-board (B2B) connector over the first surface of the substrate;
    depositing a first encapsulant over the first component while the B2B connector remains outside of the first encapsulant;
    disposing a second component over a second surface of the substrate;
    disposing a solder bump over the second surface of the substrate;
    depositing a second encapsulant over the second surface of the substrate;
    forming an opening through the second encapsulant to expose the solder bump;
    disposing a solder ball in the opening;
    reflowing the solder ball and solder bump to form a combined solder bump;
    disposing a can or mask over the B2B connector;
    forming a shielding layer over the first encapsulant and the can or mask; and
    removing the can or mask after forming the shielding layer.

2. The method of claim 1, further including disposing the substrate on a film carrier, wherein the can or mask rests on the film carrier while forming the shielding layer.

3. The method of claim 2, wherein removing the can or mask removes an entirety of the can or mask.

4. The method of claim 2, wherein the film carrier includes an opening formed through the film carrier under the combined solder bump.

5. The method of claim 1, further including depositing the first encapsulant into a mold cavity, wherein the first component is within the mold cavity and the B2B connector is outside the mold cavity.

6. A method of making a semiconductor device, comprising:
    providing a substrate;
    disposing a first component and a board-to-board (B2B) connector over a first surface of the substrate;
    depositing a first encapsulant over the first component while the B2B connector remains outside of the first encapsulant;
    forming a shielding layer over the first encapsulant while the B2B connector remains outside of the first encapsulant;
    depositing a second encapsulant over a second surface of the substrate opposite the first surface; and
    forming a solder bump through the second encapsulant.

7. The method of claim 6, further including disposing a can over the B2B connector while forming the shielding layer.

8. The method of claim 7, further including removing the can after forming the shielding layer.

9. The method of claim 6, further including depositing the first encapsulant into a mold cavity, wherein the first component is within the mold cavity and the B2B connector is outside the mold cavity.

10. The method of claim 6, further including:
    disposing a third component on the second surface of the substrate; and
    depositing the second encapsulant over the third component.

11. A method of making a semiconductor device, comprising:
    providing a substrate;
    disposing a first component over a first surface of the substrate;
    disposing a board-to-board (B2B) connector over the first surface of the substrate;
    depositing a first encapsulant over the first component;
    forming a shielding layer over the first encapsulant;
    disposing a solder bump over a second surface of the substrate opposite the first surface;
    depositing a second encapsulant over the second surface of the substrate;
    forming an opening through the second encapsulant to expose the solder bump;
    disposing a solder ball in the opening; and
    reflowing the solder ball and solder bump into a combined solder bump.

12. The method of claim 11, further including disposing a can over the B2B connector while forming the shielding layer.

13. The method of claim 11, further including leaving a portion of the substrate and the B2B connector exposed from the first encapsulant and shielding layer.

14. The method of claim 11, further including disposing a semiconductor die over the second surface of the substrate.

15. The method of claim 11, further including removing a portion of the shielding layer to expose a portion of the substrate.

16. A method of making a semiconductor device, comprising:
    providing a substrate;
    disposing a first component over a first surface of the substrate;
    disposing a board-to-board (B2B) connector over the first surface of the substrate;
    depositing a first encapsulant over the first component;
    forming a shielding layer over the first encapsulant;
    disposing a solder bump over a second surface of the substrate;
    depositing a second encapsulant over the solder bump;
    forming an opening through the second encapsulant to expose the solder bump;
    disposing a solder ball in the opening; and
    reflowing the solder ball and solder bump into a combined solder bump.

17. The method of claim 16, further including disposing a can or mask over the B2B connector while the shielding layer is formed.

18. The method of claim 16, further including leaving a portion of the substrate exposed from the first encapsulant and shielding layer.

19. The method of claim 16, further including disposing a semiconductor die over the second surface of the substrate.

* * * * *